United States Patent
Imamura et al.

(10) Patent No.: US 9,355,815 B2
(45) Date of Patent: May 31, 2016

(54) ELECTRON MICROSCOPE AND ELECTRON BEAM DETECTOR

(71) Applicant: HITACHI HIGH-TECHNOLOGIES CORPORATION, Tokyo (JP)

(72) Inventors: Shin Imamura, Tokyo (JP); Takashi Ohshima, Tokyo (JP); Yoichi Ose, Tokyo (JP); Kenichi Hirane, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/423,081

(22) PCT Filed: Aug. 9, 2013

(86) PCT No.: PCT/JP2013/071611
§ 371 (c)(1),
(2) Date: Feb. 20, 2015

(87) PCT Pub. No.: WO2014/050326
PCT Pub. Date: Apr. 3, 2014

(65) Prior Publication Data
US 2015/0214002 A1 Jul. 30, 2015

(30) Foreign Application Priority Data

Sep. 25, 2012 (JP) ................ 2012-210796

(51) Int. Cl.
*H01J 37/00* (2006.01)
*H01J 37/244* (2006.01)
*H01J 37/28* (2006.01)

(52) U.S. Cl.
CPC .............. *H01J 37/244* (2013.01); *H01J 37/28* (2013.01); *H01J 2237/063* (2013.01); *H01J 2237/2443* (2013.01); *H01J 2237/2445* (2013.01); *H01J 2237/28* (2013.01); *H01J 2237/2801* (2013.01)

(58) Field of Classification Search
CPC ... H01J 37/244; H01J 37/28; H01J 2237/063; H01J 2237/2443; H01J 2237/2801
USPC ................... 250/306, 307, 310, 311
See application file for complete search history.

(56) References Cited

U.S. PATENT DOCUMENTS 4,587,425 A * 5/1986 Plows ........................ 250/305
4,700,075 A   10/1987 Kurz et al.
(Continued)

FOREIGN PATENT DOCUMENTS

JP   54-18269      2/1979
JP   59-197881 A  11/1984
(Continued)

OTHER PUBLICATIONS

International Search Report PCT/JP2013/071611 dated Sep. 24, 2013.
Notification of Reasons for Refusal Japanese Patent Application No. 2012-210796 dated Oct. 6, 2015.

*Primary Examiner* — Michael Maskell
(74) *Attorney, Agent, or Firm* — McDermott Will & Emery LLP (57) ABSTRACT

An electron microscope is provided with a scintillator (7) and a light guide (8). The scintillator (7) has an index of refraction greater than the index of refraction of the light guide (8), and an end surface (72) joined to the light guide (8) is formed from a curved surface with a convex shape on the outside. The scintillator (7) is formed by a Y—Al—O based ceramic sintered body represented by the compositional formula $(Ln_{1-x}Ce_x)_3M_5O_{12}$ (wherein Ln represents at least one element selected from the group consisting of Y, Gd, La, and Lu, and M represents either or both of Al and Ga).

8 Claims, 5 Drawing Sheets

(56) References Cited

U.S. PATENT DOCUMENTS

| | | | |
|---|---|---|---|
| 5,012,103 A | | 4/1991 | Tanaka et al. |
| 5,635,720 A | * | 6/1997 | Mooney et al. .............. 250/397 |
| 6,642,520 B2 | | 11/2003 | Kimura et al. |
| 8,294,097 B2 | * | 10/2012 | Katane et al. ................. 250/310 |
| 2011/0139984 A1 | | 6/2011 | Kurata |
| 2013/0234032 A1 | * | 9/2013 | Wang et al. ................... 250/368 |
| 2013/0334430 A1 | * | 12/2013 | Wang et al. ................... 250/368 |

FOREIGN PATENT DOCUMENTS

| | | |
|---|---|---|
| JP | 61-164179 A | 7/1986 |
| JP | 2-118485 A | 5/1990 |
| JP | 11-273608 A | 10/1999 |
| JP | 2000-299078 A | 10/2000 |
| JP | 2012-013460 A | 1/2012 |
| JP | 2012-500447 A | 1/2012 |
| JP | 2012-180399 A | 9/2012 |

* cited by examiner

ELECTRON MICROSCOPE AND ELECTRON BEAM DETECTOR

CROSS-REFERECE TO RELATED APPLICATIONS

This application is the U.S. National Phase of PCT/JP2013/071611 filed Aug.9,2013, which claims priority from Japanese Patent Application No.2012-210796 filed Sep. 25, 2012. The subject matter of each is incorporated herein by reference herein in entirety.

TECHNICAL FIELD

The present invention relates to an electron microscope and an electron beam detector used in the electron microscope.

BACKGROUND ART

There has been widely known a scanning electron microscope configured to generate and display a two-dimensional image of a scanned observation target region of a sample by irradiating the sample with a converged primary electron beam in the way of two-dimensionally scanning the observation target region on the surface of the sample with the primary electron beam, detecting signal electrons emitted from an irradiation position with the primary electron beam, and mapping the detection signal in synchronization with a scanning position of the primary electron beam.

The signal electrons emitted from the sample surface are classified broadly into secondary electrons and reflected electrons according to energy. The reflected electrons are electrons emitted from the sample surface again after incident electrons repeat elastic scattering and non-elastic scattering within the sample. Therefore, the reflected electrons have a peak in a generation volume at approximately the same energy level as the incident electrons. On the other hand, the secondary electrons mean electrons emitted from the sample surface among low-energy electrons generated from the reflected electrons when they undergo non-elastic scattering. Therefore, the secondary electrons have a peak in a generation volume at an energy of about several eV. Generally, signal electrons having an energy of less than 50 eV are called secondary electrons to be distinguished from the reflected electrons.

As for the scanning electron microscope, it has been known that an observed image (secondary electron image) of the sample based on the secondary electrons and an observed image (reflected electron image) of the sample based on the reflected electrons contain different information. In other words, the secondary electron image is an observed image highlighting information on unevenness and potentials on the sample surface, while the reflected electron image is an observed image highlighting information on sample composition and crystal orientation. This is because of the following reason. Specifically, in the case of the secondary electrons, the generation volume is likely to be influenced by the shape of the sample surface or surface potential due to the small energy. On the other hand, in the case of the reflected electrons, the generation volume depends on the average atomic number of the sample. Moreover, it is also known that channeling contrast also results from the reflected electrons, the channeling contrast being observed on a sample having the same composition in the case where the crystal orientation on the sample surface is partially different or a crystal defect or the like is contained.

The scanning electron microscope has been required to more clearly capture not only the unevenness on the sample surface but also the contrast or channeling contrast representing a sample composition as described above. In other words, for the scanning electron microscope, there has been a demand for a method of acquiring a sample observation image based on reflected electrons quickly and easily with high sensitivity.

Generally, in order to irradiate a primary electron beam onto a sample from above and detect reflected electrons, an electron beam detector needs to be disposed immediately above the sample. In such a case, because of the need to reduce the size of the electron beam detector, there has heretofore been used a single crystal scintillator as disclosed in Patent Document 1, for example, as such an electron beam detector.

Moreover, in order to obtain a reflected electron image with clearer contrast or channeling contrast that represents the sample composition, noise of the image needs to be reduced by detecting reflected electrons while separating them from secondary electrons as much as possible, for example. Patent Documents 2 to 4 disclose a method for separating reflected electrons from secondary electrons based on a difference in energy or trajectory.

PRIOR ART DOCUMENT

Patent Document

Patent Document 1: Japanese Patent Application Publication No. 61-164179
Patent Document 2: Japanese Patent Application Publication No. 11-273608
Patent Document 3: Japanese Patent Application Publication No. 59-197881
Patent Document 4: Japanese Patent Application Publication No. 2000-299078

SUMMARY OF THE INVENTION

Problem to be Solved by the Invention

However, there is a problem that the single crystal scintillator is difficult to process, has no degree of freedom of shape formation, is expensive, and the like. Moreover, the separation of the reflected electrons from the secondary electrons based on the difference in energy or trajectory, alone, results in a reduction in the amount of reflected electrons detected, and leads to a problem with sensitivity and response.

In consideration of the above problems with the conventional technologies, it is an object of the present invention to provide an electron beam detector capable of improving sensitivity and response of reflected electron detection, and also to provide an electron microscope to which the electron beam detector is applied.

Means for Solving the Problem

An electron microscope according to the present invention includes: a plate-like scintillator configured to make luminescence by incidence of an electron beam; and a light guide configured to pass the luminescence made by the scintillator, the light guide having a refractive index smaller than that of the scintillator, wherein the scintillator has apart of an end face formed into an outward convex curved face, and is joined to the light guide through the convex curved end face.

Furthermore, the scintillator is formed of Y—Al—O based sintered ceramic represented by a chemical formula $(Ln_{1-x}Ce_x)_3M_5O_{12}$ (wherein Ln represents at least one element selected from Y, Gd, La and Lu, and M represents at least one element selected from Al and Ga).

Effects of the Invention

The present invention makes it possible to improve sensitivity and response of reflected electron detection by an electron beam detector used in an electron microscope.

MODES FOR CARRYING OUT THE INVENTION

With reference to the drawings, an embodiment of the present invention is described in detail below.

Figure 1:
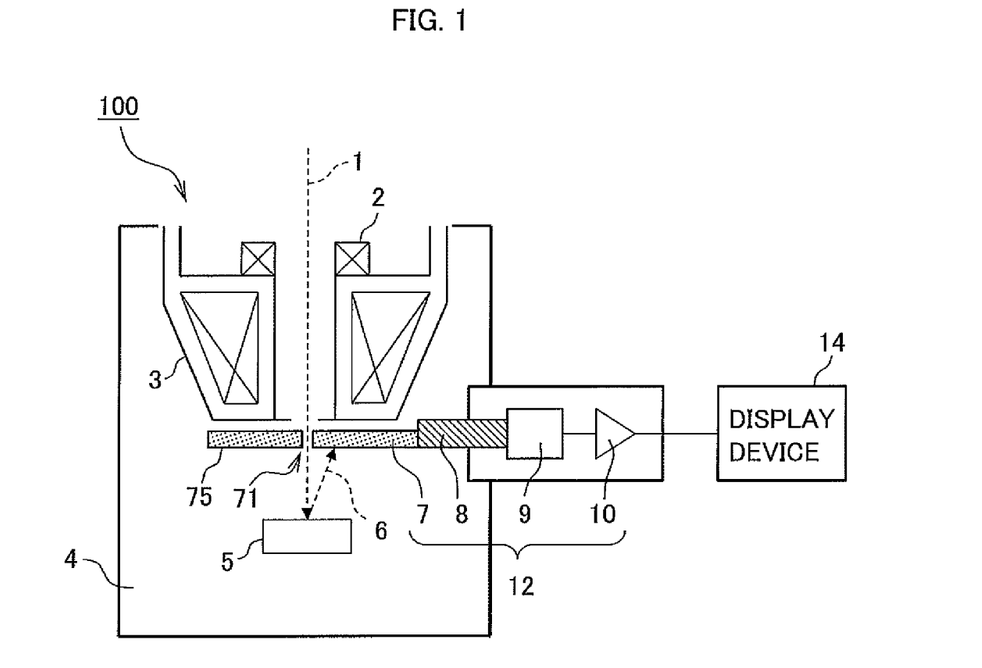
FIG. 1 is a diagram showing a configuration example of a main part of an electron microscope according to an embodiment of the present invention.

FIG. 1 is a diagram showing a configuration example of a main part of an electron microscope 100 according to the embodiment of the present invention. As shown in FIG. 1, the main part of the electron microscope 100 according to the embodiment of the present invention includes a scanning lens 2, an objective lens 3, a sample chamber 4, a scintillator 7, a light guide 8, a photoelectric conversion element 9, an amplifier circuit 10, a display device 14, and the like.

Inside the sample chamber 4, there are further provided an unillustrated stage to hold a sample 5, an unillustrated stage moving mechanism to set an observation target region of the sample 5 by moving the stage, and the like. During observation, the sample 5 is disposed immediately below the objective lens 3 inside the sample chamber 4. In this event, the scintillator 7 is disposed between the objective lens 3 and the sample 5.

In the electron microscope 100 thus configured, a primary electron beam 1 emitted from an unillustrated electron gun is deflected by the scanning lens 2 to scan the observation target region of the sample 5. Then, the primary electron beam 1 is focused by the objective lens 3 and irradiated onto the surface of the sample 5. In this event, an electron passing hole 71 is provided at a position near the central part of the scintillator 7 where the primary electron beam 1 passes. The primary electron beam 1 is irradiated onto the surface of the sample 5 after passing through the electron passing hole 71.

When the primary electron beam 1 is irradiated onto the sample 5, reflected electrons 6, unillustrated secondary electrons, and the like are emitted from the surface of the sample 5. The reflected electrons 6 are made incident on the scintillator 7 from the lower face side. Note that, in the present specification, the lower face of the scintillator 7 is hereinafter referred to as an electron incident face 75.

Here, the objective lens 3 is of a semi-in-lens type, for example. In such a case, unillustrated secondary electrons are gathered up along an optical axis of the primary electron beam 1 by a strong magnetic field of the objective lens 3. Then, the secondary electrons pass upward through the electron passing hole 71, and are further drawn into the objective lens 3. Therefore, an amount of the secondary electrons made incident on the scintillator 7 is small.

When the reflected electrons 6 are made incident on the scintillator 7, the scintillator 7 that is a phosphor makes luminescence. The luminescence made by the scintillator 7 is guided by the light guide 8, enters the photoelectric conversion element 9, such as a photomultiplier tube and a semiconductor light receiving element, and is then converted into an electric signal by the photoelectric conversion element 9. The electric signal thus converted (reflected electron detection signal) corresponding to the amount of the reflected electrons is amplified by the amplifier circuit 10 and transmitted to the display device 14.

Note that, in the present specification, the part consisting of the scintillator 7, the light guide 8, the photoelectric conversion element 9 and the amplifier circuit 10 is referred to as an electron beam detector 12 (however, the electron beam detector 12 may not include the amplifier circuit 10).

In this embodiment, Y—Al—O based sintered ceramic with Ce as an activator is used as a material of the scintillator 7. The Y—Al—O based sintered ceramic with Ce as the activator means a sintered ceramic obtained by sintering a material represented by the chemical formula $(Ln_{1-x}Ce_x)_3M_5O_{12}$. Here, Ln represents at least one of elements Y, Gd, La, and Lu, and M represents at least one of elements Al and Ga. Moreover, in this embodiment, a composition ratio x of Ce is within a range of $0.002 \leq x \leq 0.025$. The reason for that is described separately with reference to the drawings.

The Y—Al—O based sintered ceramic as described above can be manufactured by a method including mixing of oxide powders as raw materials, packing the mixed oxide powders into an appropriate shape, maintaining the filled material at a proper temperature, e.g., 1400 to 1600° C. for a certain period of time, and the like. Alternatively, as the raw materials, submicron particles obtained by sedimentation in liquid, or the like can also be used.

Note that, as the material of the scintillator 7, a conventionally generally used single crystal material is produced by single crystal growth process by melt pulling method or the like. The production is troublesome and expensive, and also limits the size and shape. In other words, the single crystal material produced by crystal growth by pulling has a cylindrical shape, and also has a problem that an attempt to increase the diameter thereof increases device cost. Therefore, in the case of the single crystal material, the shape of the scintillator 7 generally has to be a round disk shape. However, in the case of the disk-shaped scintillator 7, luminescence is emitted in all directions. This causes large light intensity loss and brings about a problem that the intensity of incident light into the light guide 8 cannot be increased.

As a matter of course, with the single crystal material, the scintillator 7 can be fabricated to have a square shape. However, in such a case, a square-shaped plate is cut out of a not very large disk, and a peripheral portion is discarded. Thus, material loss and material cost are increased.

On the other hand, for the scintillator 7 using the Y—Al—O based sintered ceramic, material powders need only be filled into an appropriate shape and then sintered. Thus, the scintillator 7 can be fabricated at relatively low cost. Moreover, the shape of the ceramics is almost determined based on the shape of the filled powders. Thus, a large degree of freedom is obtained in designing the size and shape of the scintillator 7. Therefore, by devising the shape of the scintillator 7, the light intensity loss in the scintillator 7 is reduced, and thus the intensity of incident light into the light guide 8 can be increased.

Moreover, the Y—Al—O based sintered ceramic is polycrystal and basically an aggregate of microcrystals having various crystal orientations. Thus, no crystalline anisotropy characteristics appear in the sintered ceramics as a whole. Therefore, unlike the single crystal material having the same crystal orientation as a whole, production cost is also reduced since there is no need to consider the crystal orientation.

Figure 2:
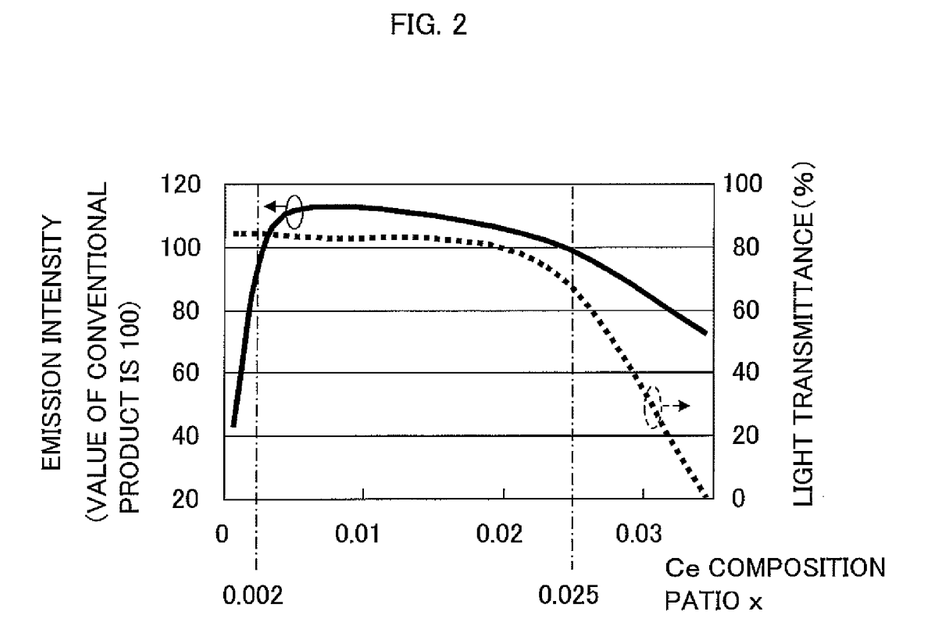
FIG. 2 shows an example of a Ce composition ratio-dependent characteristic graph of emission intensity and light transmittance of luminescence made by Y—Al—O based sintered ceramic.

FIG. 2 shows an example of a Ce composition ratio-dependent characteristic graph of emission intensity and light transmittance of luminescence made by the Y—Al—O based sintered ceramic. In FIG. 2, the horizontal axis of the graph indicates the Ce composition ratio x, the vertical axis on the left side of the graph indicates the luminescence emission intensity, and the vertical axis on the right side thereof indicates the light transmittance. Also, the heavy solid curve represents measured values of the luminescence emission intensity, and the heavy dotted curve represents the light transmittance.

Here, the measured values of the emission intensity are obtained when an electron beam accelerated at 10 kV is irradiated onto a thin plate (20 mm square and 2 mm thick) of Y—Al—O based sintered ceramic. However, in FIG. 2, the measured values are represented by relative values assuming that the emission intensity of a conventionally generally used single crystal scintillator is 100.

Note that the dependence characteristics of such emission intensity on the Ce composition ratio x are not limited to the electron beam accelerated at 10 kV, but show approximately the same trend for electron beams having various energies.

Moreover, the measured values of the light transmittance are obtained when light having a wavelength of 500 to 650 nm, particularly, about 550 nm is made incident on the thin plate (20 mm square and 2 mm thick) of Y—Al—O based sintered ceramic. Note that the Y—Al—O based sintered ceramic used in this embodiment makes luminescence of 500 to 650 nm by electron beam irradiation.

It can be seen from the graph of FIG. 2 that the Y—Al—O based sintered ceramic shows the emission intensity exceeding that of the conventional single crystal scintillator, when the Ce composition ratio x is within the range of 0.002 to 0.025.

Meanwhile, the light transmittance shows the value of approximately 80% or more when the Ce composition ratio x is 0.02 or less, and the value falls below 80% when the Ce composition ratio x exceeds 0.02. However, the light transmittance shows the value larger than 60% when the Ce composition ratio x is 0.025 or less. Therefore, it can be said that the Y—Al—O based sintered ceramic have good light transmittance when the Ce composition ratio x is 0.025 or less.

Note that the data of the emission intensity and light transmittance in the graph of FIG. 2 is acquired when the Y—Al—O based sintered ceramic is the material represented by the chemical formula $(Y_{1-x}Ce_x)_3Al_5O_{12}$. However, approximately the same data is obtained when the material is represented by the chemical formula $(Ln_{1-x}Ce_x)_3M_5O_{12}$, and Ln represents at least one of the elements Y, Gd, La, and Lu, and M represents at least one of the elements Al and Ga.

Therefore, in this embodiment, as described above, the Y—Al—O based sintered ceramic represented by the chemical formula $(Ln_{1-x}Ce_x)_3M_5O_{12}$ (wherein Ln represents at least one of the elements Y, Gd, La and Lu, and M represents at least one of the elements Al and Ga) with the Ce composition ratio x of $0.002 \leq x \leq 0.025$ is used as the material of the scintillator 7.

Moreover, as the material of the light guide 8, a highly transparent material is used, such as acrylic resin, polycarbonate resin, plate glass and silica glass. Alternatively, a bendable light guiding body such as optical fiber may be used. Moreover, a space may be provided between the scintillator 7 and the light guide 8. Alternatively, the scintillator 7 and the light guide 8 may be joined with a junction material such as transparent resin, optical cement and matching oil.

As described above, the scintillator 7 used in this embodiment has large luminescence emission intensity and good light transmittance. Thus, the electron beam detector 12 including the scintillator 7 and the light guide 8 can achieve performance such as high sensitivity and fast response.

Figure 3:
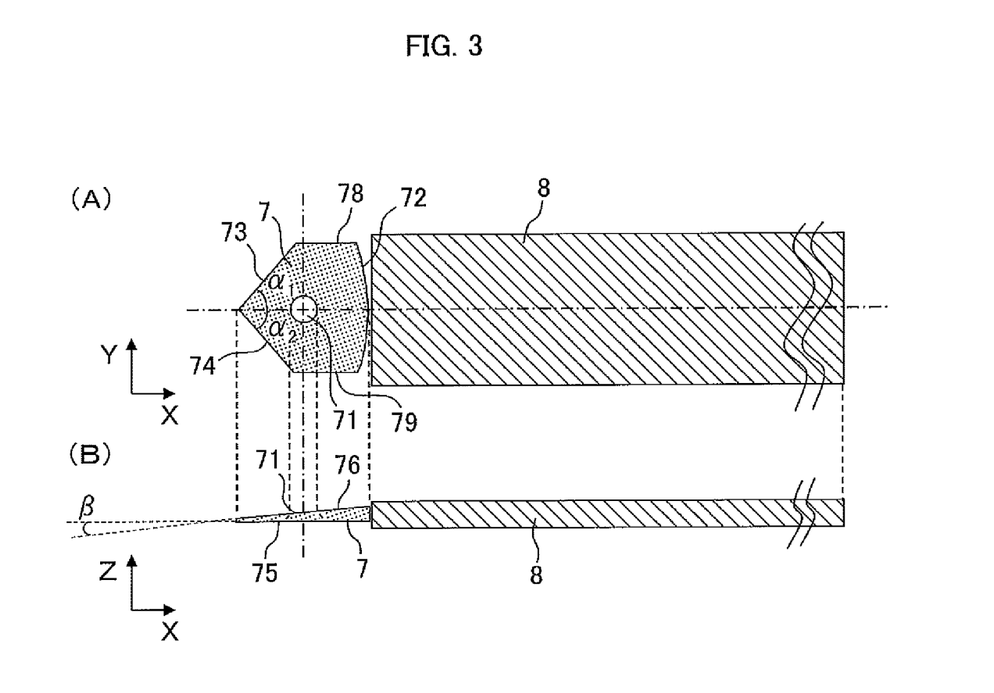
FIGS. 3A and 3B are diagrams showing an example of the shapes of a scintillator and a light guide used in the electron microscope according to this embodiment, FIG. 3(A) showing an example of a top view and FIG. 3(B) showing an example of a side view.

FIGS. 3(A) and 3(B) are diagrams showing an example of the shapes of the scintillator 7 and the light guide 8 used in the electron microscope 100 according to this embodiment. FIG. 3(A) shows an example of a top view. FIG. 3(B) shows an example of a side view. However, as to the shape of the light guide 8, only the shape in the vicinity of the connection with the scintillator 7 is shown in FIGS. 3(A) and 3(B).

Note that, in FIG. 3(A), for the purpose of illustration, it is assumed that a length direction of the light guide 8 is the X-axis and a width direction of the light guide 8 is the Y-axis. Also, in FIG. 3(B), for the purpose of illustration, it is assumed that the length direction of the light guide 8 is the X-axis and a thickness direction of the light guide 8 and the scintillator 7 is the Z-axis. Note that the same goes for FIGS. 4 to 10.

As shown in FIGS. 3(A) and 3(B), the scintillator 7 has the following shape characteristics besides the electron passing hole 71 formed in the central part thereof to pass the primary electron beam 1 and the like.

First, a first characteristic is that an end face 72 joined to the light guide 8, among end faces of ends of the scintillator 7, is formed to have an outward convex curved face. In this structure, the scintillator 7 and the light guide 8 may be joined with a space (i.e., air or a vacuum layer) interposed therebetween, or may be joined with a junction material filled in the space, such as transparent resin, optical cement and matching oil.

Moreover, a second characteristic is that the end of the scintillator 7 opposite to the end joined to the light guide 8 is formed to have two end faces 73 and 74 that are approximately parallel to the Z-axis and form angles $\alpha_1$ and $\alpha_2$ with the X-axis, respectively. Note that the angles $\alpha_1$ and $\alpha_2$ may take the same value or different values. However, $\alpha_1 + \alpha_2 < 180$ degrees.

Furthermore, a third characteristic is that an upper face 76 of the scintillator 7 opposed to the electron incident face 75 thereof (the lower face of the scintillator 7) is tilted at a tilt angle $\beta$ to the electron incident face 75. In this case, as to the thickness of the scintillator 7, the closer to the end face 72 opposed to the light guide 8, the larger (thicker) the thickness. On the other hand, the more away from the end face 72, the smaller (thinner) the thickness.

Furthermore, a metal layer functioning as a light reflection layer is formed on the faces of the scintillator 7 having the above shape characteristics except for the end face 72 joined to the light guide 8. In this case, while any metal that reflects light and has a large reflectivity may be used as a material of the metal layer, Al is used in general. Note that the metal layer such as an Al layer can be formed using vacuum deposition or the like.

The reason why the scintillator 7 has the shape having the above characteristics and the metal layer such as the Al layer is formed on the faces other than the end face 72 joined to the light guide 8 is that as much luminescence generated in the scintillator 7 as possible can be made incident on the light guide 8. Hereinafter, description is provided for operations and effects of the shape of the scintillator 7 and the metal layer.

The metal layer such as the Al layer formed on the faces of the scintillator 7 functions as the light reflection layer, and prevents the luminescence generated in the scintillator 7 from dissipating to the outside. More specifically, the metal layer such as the Al layer has the effect to suppress light intensity loss of the luminescence generated in the scintillator 7. Moreover, by electrically connecting the metal layer formed on the faces of the scintillator 7 to a housing of the electron microscope 100 or the like, effects can also be expected, such as to prevent charging up of the scintillator 7, improve S/N (Signal to Noise Ratio) of a detection signal based on the reflected electrons 6 made incident on the scintillator 7, and the like.

Here, in the metal layer formed on the faces of the scintillator 7, a part formed on the electron incident face 75 (the lower face of the scintillator 7) needs to have a thickness that does not hinder the incidence of the reflected electrons 6. More specifically, the metal layer needs to have a thickness that sufficiently reflects light and allows the incidence of the reflected electrons 6. Furthermore, the thickness needs to block secondary electrons having an energy of 50 eV or less.

The thickness of the metal layer that satisfies such conditions as described above is preferably 100 nm or less, i.e., about 50 nm, when the metal layer is the Al layer. In this embodiment, the Al layer having a target thickness of 50 nm is formed on the electron incident face 75 of the scintillator 7.

Moreover, in the metal layer formed on the faces of the scintillator 7, a part formed on the faces other than the electron incident face 75 have no need to consider the incidence of the reflected electrons 6. Therefore, that part of the metal layer preferably has a large thickness. Such a large thickness can improve the light reflectivity and reduce the amount of dissipation of the luminescence, which is generated in the scintillator 7, to the outside.

Note that, when the metal layer is the Al layer, the thickness thereof is preferably 100 nm or more. In this embodiment, the Al layer having a target thickness of 200 nm is formed on the faces of the scintillator 7 except for the end face 72 joined to the light guide 8 and the electron incident face 75.

Next, when the reflected electrons 6 are made incident on the scintillator 7 thus configured from the electron incident face 75 side, luminescence is generated in the scintillator 7. The luminescence generated in the scintillator 7 reaches the end face 72 joined to the light guide 8 directly or after being multiply reflected by the metal layer formed on the faces of the scintillator 7.

As described above, in this embodiment, the upper face 76 of the scintillator 7 is tilted at the tilt angle 8 to the electron incident face 75 (the third characteristic) or the end faces 73 and 74 of the end, of the scintillator 7, opposite to the end joined to the light guide 8 are tilted at the angles $\alpha_1$ and $\alpha_2$ with respect to the X-axis (the second characteristic). Therefore, the luminescence generated in the scintillator 7 is likely to be reflected toward the end face 72 joined to the light guide 8. Thus, the luminescence can reach the end face 72 through a small number of multiple reflections on average.

The small number of multiple reflections means a shorter distance required for the luminescence to reach the end face 72 on the light guide 8 side. Accordingly, time required for the luminescence to reach the end face 72 is shortened, and loss of the luminescence is also reduced. As a result, the response of the electron beam detector 12 using the scintillator 7 described above is speeded up, which improves the sensitivity.

Note that various studies conducted by the inventors of the present invention have found out that, when the angles $\alpha_1$ and $\alpha_2$ formed between the end faces 73 and 74 of the end of the scintillator 7 and the X-axis are 30 degrees $\leq \alpha_1$, $\alpha_2 < 90$ degrees, the luminescence can be effectively guided to the end face 72. Likewise, the studies have also found out that, when the tilt angle $\beta$ formed between the upper face 76 of the scintillator 7 and the electron incident face 75 is 0 degrees $< \beta \leq 60$ degrees, the luminescence can be effectively guided to the end face 72.

As described above, the luminescence generated in the scintillator 7 leaves the scintillator 7 on arrival at the end face 72 where no metal layer is formed, and is then made incident on the light guide 8. In this case, it is required to make as much luminescence as possible incident on the light guide 8. For that purpose, in this embodiment, the end face 72 of the scintillator 7 is formed to be an outward convex curved face. This is related to the fact that the material of the scintillator 7, that is, the Y—Al—O based sintered ceramic with Ce as the activator has a large refractive index.

For example, the Y—Al—O based sintered ceramic with Ce as the activator has a refractive index of about 1.8. On the other hand, transparent resin, glass or the like, which is commonly used as the material of the light guide 8, has a refractive index of about 1.4 to 1.6. Meanwhile, commonly used optical cement, bonding resin or the like has a refractive index of 1.6 or less. Also, air and vacuum have a refractive index of about 1.

Therefore, the luminescence generated in the scintillator 7 is made incident from a substance having a large refractive index into a substance having a small refractive index. In such a case, there occurs a phenomenon called total internal reflection that the luminescence generated in the scintillator 7 tries to leave the scintillator 7 at an angle not less than a certain angle. As a result, the luminescence cannot get out of the scintillator 7.

Incidentally, when light leaves a substance (the scintillator 7) having a refractive index of 1.8 into the air or vacuum (refractive index of about 1.0), a critical angle of the total internal reflection is about 34 degrees. Therefore, when the luminescence generated in the scintillator 7 is made incident on a boundary face (the end face 72) between the scintillator 7 and the air or vacuum at an incident angle larger than about 34 degrees, the total internal reflection occurs, which prevents the luminescence from getting out of the scintillator 7. Note that, when light leaves the scintillator 7 having the refractive index of 1.8 into bonding resin having a refractive index of 1.6 or the like, the critical angle of the total internal reflection is about 63 degrees.

In other words, since the refractive index of the scintillator 7 is larger than that of the light guide 8, when the scintillator 7 and the light guide 8 are joined, total internal reflection occurs on the boundary face therebetween, causing intensity loss of incident light on the light guide 8. Therefore, in this embodiment, the total internal reflection on the boundary face is prevented from occurring by forming the end face 72 of the scintillator 7 into the outward convex curved face. Thus, light intensity loss on the boundary face is reduced. Hereinafter, description is given of the reason why the total internal reflection becomes less likely to occur by forming the end face 72 of the scintillator 7 into the outward convex curved surface.

Figure 10:
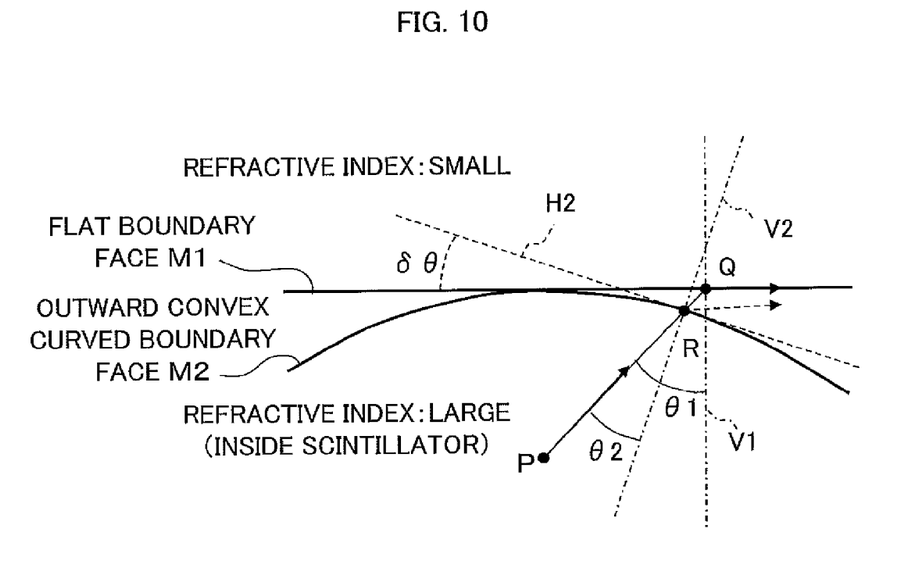
FIG. 10 is a diagram schematically showing a difference in how total internal reflection occurs between a flat boundary face and an outward convex boundary face, when light leaves from inside of a substance having a large refractive index into a substance (including vacuum) having a small refractive index.

FIG. 10 is a diagram schematically showing a difference in how total internal reflection occurs between a flat boundary face and an outward convex boundary face, when light leaves from inside of a substance having a large refractive index into a substance (including vacuum) having a small refractive index. In FIG. 10, the substance (the scintillator 7) in the lower region has a large refractive index, and the substance in the upper region has a small refractive index. The lower region and the upper region are separated by a flat (planar) boundary face M1 or a curved boundary face M2 that is convex outward when seen from the lower region side.

First, total internal reflection on the flat boundary face M1 is described. When an incident angle θ1 of a light beam reaching point Q on the boundary face M1 from certain point P within the lower region (the scintillator 7) having the large refractive index, the light beam being emitted from point P, is the critical angle of the total internal reflection, the light beam does not get into the upper region having the small refractive index. Here, the incident angle θ1 is an angle formed by light beam PQ and line V1 that passes through point Q and is perpendicular to the boundary face M1.

On the other hand, when the boundary between the upper and lower regions is the outward convex curved boundary face M2, a light beam reaching point Q on the face corresponding to the boundary face M1 from point P intersects the boundary face M2 at point R. In this event, an incident angle θ2 of light beam PR on the boundary face M2 is an angle formed by light beam PR and line V2 that is perpendicular to tangent plane H2 of the boundary face M2 at point R and passes through point R. Here, when θ1 and θ2 are compared, it can be seen that θ2 is smaller than θ1 by an angle 50 formed by the boundary face M1 and tangent plane H. In other words, θ2=θ1−δθ.

This means that even a light beam emitted from certain point P, which undergoes total internal reflection when the boundary is the flat boundary face M1, does not undergo total internal reflection when the boundary is the outward convex curved boundary face M2. More specifically, when the shape of the end face 72 joined to the light guide 8 of the scintillator 7 is the outward convex curved face, more luminescence inside the scintillator 7 gets out of the scintillator 7. In other words, more light gets out of the scintillator 7.

The analysis done by the inventors has found out that, when there is an air or vacuum space outside with the scintillator 7 having a refractive index of 1.8, the occurrence of total internal reflection is significantly reduced when a curvature of the end face 72 is set to 5% or more. Therefore, the curvature of the end face 72 is preferably set to 5% or more. When the curvature of the end face 72 is set to 5% or more, an amount of luminescence to be taken out of the scintillator 7 can be increased.

Here, curvature c of curved face S (not shown) means a value obtained by c=Δd/d where Δd is a distance between point Q and tangent plane H when a point on curved face S away from point P (not shown) on curved face S by distance d along curved face S is point Q (not shown) and a plane tangent to curved face S at point P is tangent plane H.

Note that, in FIG. 3A, the end faces (the end faces 73 and 74, an end face 78 connecting the end faces 72 and 73 and an end face 79 connecting the end faces 72 and 74) of the ends of the scintillator 7 except for the end face 72 are linearly (planarly) drawn. However, when the curvature is less than 5%, the end faces may be outward convex or inward concave curved faces. Note, however, that, even when reflection metal layers are formed on such end faces, the end faces are preferably inward concave curved faces, considering ease of total internal reflection.

Moreover, in this embodiment, as shown in FIG. 3A, the width (Y-direction) of the end of the light guide 8, at which the end face 72 of the scintillator 7 is joined to the light guide 8, is larger than the width of the end face 72 portion of the scintillator 7. Also, as shown in FIG. 3B, the thickness (Z-direction) of the end of the light guide 8, at which the end face 72 of the scintillator 7 is joined to the light guide 8, is larger than the thickness of the end face 72 portion of the scintillator 7.

As described above, the size of the end face of the end of the light guide 8 on the luminescence receiving side is set larger than the size of the end face 72 of the scintillator 7 on the luminescence emitting side. Thus, as much luminescence emitted from the end face 72 of the scintillator 7 as possible can be made incident on the light guide 8. In other words, light intensity loss can be reduced at the connection between the scintillator 7 and the light guide 8.

Moreover, as shown in FIG. 3A, if the end face 72 of the scintillator 7 is the outward convex curved face, the end face of the end of the light guide 8 opposed to the end face 72 may be flat or concave inward along the end face 72. Furthermore, there may be a space left between the end faces of the scintillator 7 and the light guide 8, or the space may be filled with a junction material such as transparent resin, optical cement and matching oil. Note that, when the space is filled with the junction material, setting the refractive index of the junction material the same as that of the light guide 8 eliminates the problem such as total internal reflection on the boundary between the junction material and the light guide 8. Thus, the problem of light intensity loss is also eliminated.

Moreover, although FIG. 3A shows that the scintillator 7 has the electron passing hole 71 formed in the central part thereof, the electron passing hole 71 is not essential. As for the electron microscope 100, the electron passing hole 71 can be omitted, and the scintillator 7 can be provided at a position on the side where the scintillator 7 does not intersect with the optical axis of the primary electron beam 1.

As described above, in this embodiment, the scintillator 7 has a structure that allows as much luminescence generated therein as possible to be made incident on the light guide 8. Thus, the intensity of light made incident on the light guide 8 is increased. More specifically, the sensitivity of electron detection by the electron beam detector 12 including the scintillator 7 can be improved.

The key points of the operations and effects of this embodiment described above are described in order below.

First, the Y—Al—O based sintered ceramic with Ce as the activator, such as $(Y_{1-x}Ce_x)_3Al_5O_{12}$, is used as the material of the scintillator 7, and the Ce composition ratio x is set to $0.002 \leq x \leq 0.025$. Thus, the emission intensity can be increased, and good light transmittance can be achieved (see FIG. 2). As a result, more luminescence is generated in the scintillator 7, and more light can pass the light guide 8. Thus, the sensitivity of electron detection by the electron beam detector 12 including the scintillator 7 can be improved.

Moreover, the scintillator 7 using the Y—Al—O based sintered ceramic is formed by packing and sintering a powder material. Thus, the cost for the formation thereof is inexpensive, and a large degree of freedom of the shape to be formed is achieved. Therefore, the degree of freedom is increased in designing the shape of the scintillator 7. Accordingly, in this embodiment, the scintillator 7 is configured to have the following shape.

The upper face 76 of the scintillator 7 is tilted at the tilt angle β to the electron incident face 75, and the end faces 73 and 74 of the end, of the scintillator 7, opposite to the end joined to the light guide 8 are tilted at the angles $\alpha_1$ and $\alpha_2$ with respect to the X-axis (see FIGS. 3A and 3B). Furthermore, light reflection layers such as Al layers are formed on the upper face 76 and lower face (electron incident face 75) of the scintillator 7 as well as on the end faces 73, 74, 78 and 79 other than the end face 72.

The luminescence generated in the scintillator 7 thus configured is likely to be reflected toward the end face 72 joined to the light guide 8. Thus, the luminescence can reach the end face 72 through a small number of multiple reflections on average. As a result, the distance and time required for the luminescence generated in the scintillator 7 to reach the end face 72 opposed to the light guide 8 are shortened, which reduces the loss of luminescence within the scintillator 7. Therefore, the response of the electron beam detector 12 including the scintillator 7 is speeded up, and thus the sensitivity is improved.

Furthermore, the end face 72, of the scintillator 7, joined to the light guide 8 is formed to have the outward convex curved face (see FIG. 3A). Thus, the amount of the luminescence generated in the scintillator 7, which undergoes total internal reflection, is reduced. Accordingly, the amount of luminescence that can be taken out toward the light guide 8 through the end face 72 can be increased. Therefore, the sensitivity of electron detection by the electron beam detector 12 including the scintillator 7 can be improved.

As described above, according to this embodiment, the sensitivity and response of reflected electron detection by the electron beam detector 12 used in the electron microscope 100 can be improved, and production cost thereof can be reduced.

According to the embodiment described above, the use of the Y—Al—O based sintered ceramic as the material of the scintillator 7 increases the degree of freedom of the shape of the scintillator 7. Therefore, various other shapes can be devised as the shape of the scintillator 7. Hereinafter, modified examples of possible shapes of the scintillator 7 are described.

Note that, in all of the following modified examples, Y—Al—O based sintered ceramic represented by the chemical formula $(Ln_{1-x}Ce_x)_3M_5O_{12}$ is used as the material of the scintillator 7. Here, Ln represents at least one of the elements Y, Gd, La and Lu, and M represents at least one of the elements Al and Ga. Also, the Ce composition ratio x is $0.002 \leq x \leq 0.025$.

First Modified Example

Figure 4:
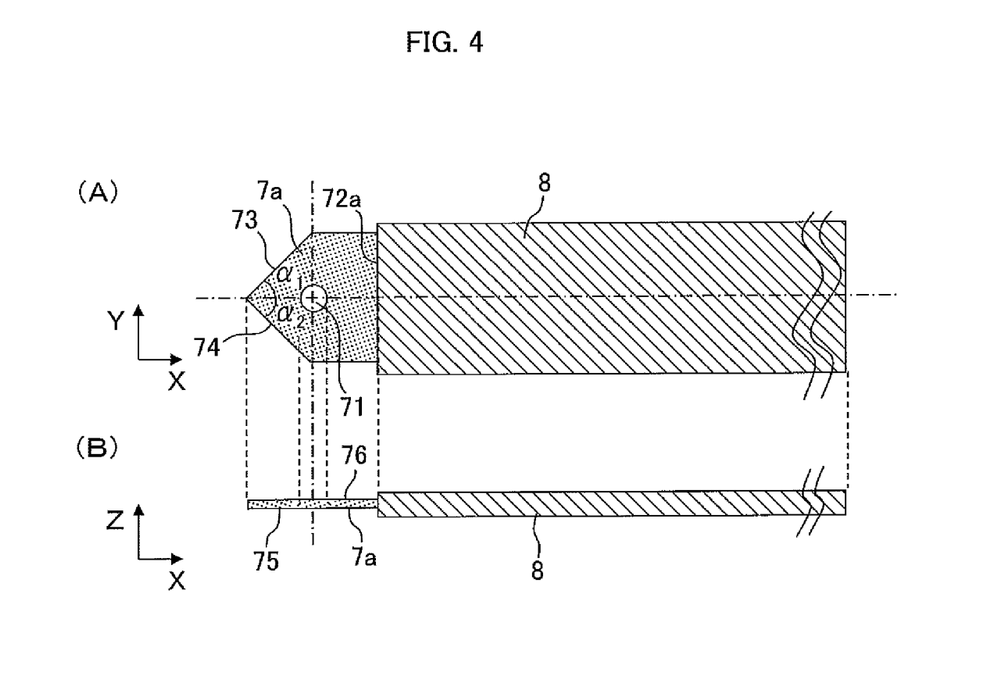
FIGS. 4A and 4B are diagrams showing an example of the shape of a scintillator according to a first modified example of the embodiment of the present invention, FIG. 4A showing an example of a top view and FIG. 4B showing an example of a side view.

FIGS. 4A and 4B are diagrams showing an example of the shape of a scintillator 7a according to a first modified example of the embodiment of the present invention. FIG. 4A shows an example of a top view and FIG. 4B shows an example of a side view. As shown in FIGS. 4A and 4B, the shape of the scintillator 7a is almost the same as that of the scintillator shown in FIGS. 3A and 3B, except for a part thereof. Only a difference in shape is described below.

In the first modified example, an upper face 76 of the scintillator 7a is parallel to an electron incident face 75 instead of being tilted thereto. Moreover, an end face 72a of the end of the scintillator 7a, which is joined to the end of the light guide 8, has a flat face instead of an outward convex curved face. In other words, the end face 72a and the end face of the end of the light guide 8, which are opposed to and in contact with the end face 72a, are flat faces perpendicular to the X-axis.

Furthermore, a metal layer to be formed as a light reflection layer is formed in the same manner as in the case of the embodiment described above. Moreover, a space is provided between the end face 72a of the scintillator 7a and the light guide 8. Alternatively, the scintillator 7 and the light guide 8 are joined with a junction material such as transparent resin, optical cement and matching oil.

An electron beam detector 12 and an electron microscope 100 manufactured using the scintillator 7a as described above achieve good characteristics such as high sensitivity of reflected electron detection and fast response. This means nothing other than an effect based on the fact that the scintillator 7a still has the characteristic that the scintillator 7a is formed of the Y—Al—O based sintered ceramic with Ce as the activator and the characteristic that the end of the scintillator 7a opposite to the end joined to the light guide 8 is formed to have two end faces 73 and 74 that are approximately parallel to the Z-axis and form angles $\alpha_1$ and $\alpha_2$ with the X-axis, among the characteristics of the scintillator 7 according to the embodiment described above.

Therefore, the same effect, to a varying degree, as that achieved in the above embodiment can also be achieved in the first modified example.

Second Modified Example

Figure 5:
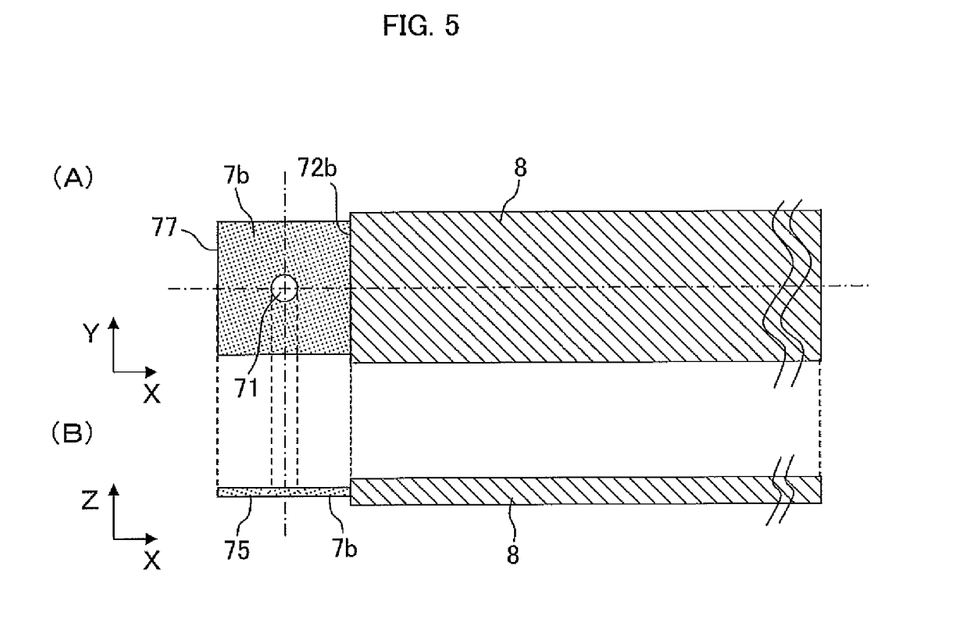
FIGS. 5A and 5B are diagrams showing an example of the shape of a scintillator according to a second modified example of the embodiment of the present invention, FIG. 5A showing an example of a top view and FIG. 5B showing an example of a side view.

FIGS. 5A and 5B are diagrams showing an example of the shape of a scintillator 7b according to a second modified example of the embodiment of the present invention. FIG. 5A shows an example of a top view and FIG. 5B shows an example of a side view. As shown in FIGS. 5A and 5B, an upper face of the scintillator 7b has a square or rectangular shape, and an end face 72b of an end of the scintillator 7b, which comes into contact with the end of the light guide 8, and an end face 77 of an end opposite to the end face 72b of the scintillator 7b are flat faces parallel to each other and perpendicular to the X-axis.

Also, a metal layer to be formed as a light reflection layer is formed in the same manner as in the case of the above embodiment. Moreover, a space is provided between the end face 72b of the scintillator 7b and the light guide 8. Alternatively, the scintillator 7b and the light guide 8 are joined with a junction material such as transparent resin, optical cement and matching oil.

An electron beam detector 12 and an electron microscope 100 manufactured using the scintillator 7b as described above achieve good characteristics such as high sensitivity of reflected electron detection and fast response. This means nothing other than an effect based on the fact that, in the second modified example, the end face 77 of the end of the scintillator 7b has a function to reflect luminescence generated in the scintillator 7b to the end face 72b on the light guide 8 side and that the scintillator 7b is formed of the Y—Al—O based sintered ceramic with Ce as the activator.

Therefore, the same effect, to a varying degree, as that achieved in the above embodiment can also be achieved in the second modified example.

Third Modified Example

Figure 6:
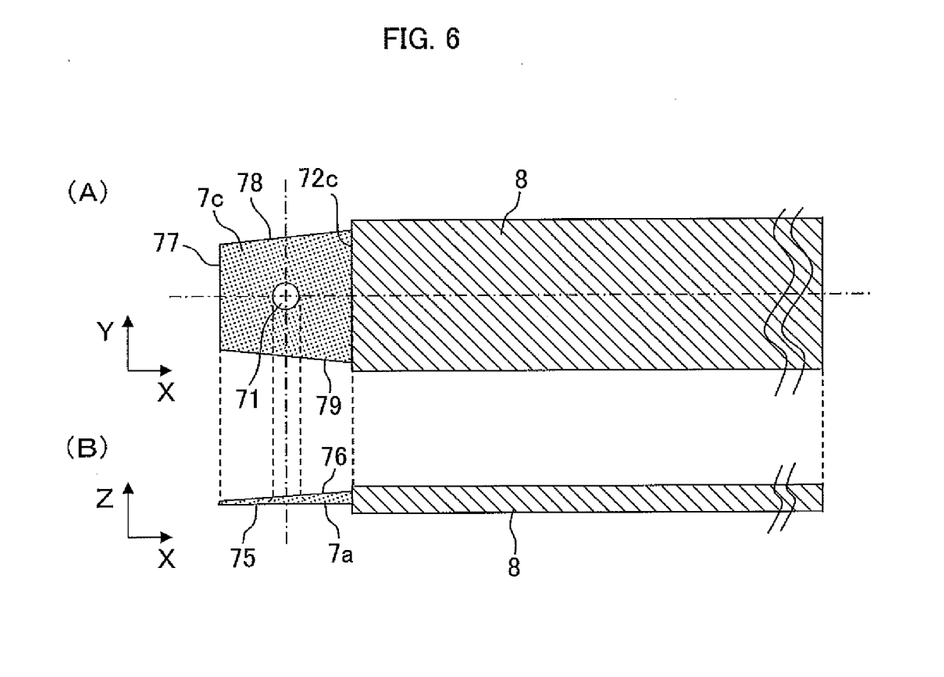
FIGS. 6A and 6B are diagrams showing an example of the shape of a scintillator according to a third modified example of the embodiment of the present invention, FIG. 6A showing an example of a top view and FIG. 6B showing an example of a side view.

FIGS. 6A and 6B are diagrams showing an example of the shape of a scintillator 7c according to a third modified example of the embodiment of the present invention. FIG. 6A shows an example of a top view and FIG. 6B shows an example of a side view. As shown in FIGS. 6A and 6B, an upper face of the scintillator 7c has a trapezoidal rectangular shape, and an end face 72c of an end of the scintillator 7c, which comes into contact with the end of the light guide 8, and an end face 77 of an end opposite to the end face 72c of the scintillator 7c are flat faces parallel to each other and perpendicular to the X-axis. Moreover, an end face 78 and an end face 79, which connect the end faces 72c and 77 of the scintillator 7c, are tilted to the X-axis. Also, the width of the scintillator 7c in the Y direction is set to be larger on the end face 72c side and smaller on the end face 77 side. More specifically, as to a distance between the end faces 78 and 79, the more away from the end face 72c, the shorter the distance. Moreover, the upper face 76 of the scintillator 7c is tilted to the electron incident face 75, and the thickness of the scintillator 7c in the Z direction is set to be larger on the end face 72c side and smaller on the end face 77 side.

Also, a metal layer to be formed as a light reflection layer is formed in the same manner as in the case of the above embodiment. Moreover, a space is provided between the end face 72c of the scintillator 7c and the light guide 8. Alternatively, the scintillator 7b and the light guide 8 are joined with a junction material such as transparent resin, optical cement and matching oil.

An electron beam detector 12 and an electron microscope 100 manufactured using the scintillator 7c as described above achieve good characteristics such as high sensitivity of reflected electron detection and fast response. This means nothing other than an effect based on the fact that, in the third modified example, the electron incident face 75, the upper face 76 and the end faces 77 to 79 at the end of the scintillator 7c have a function to pass luminescence generated in the scintillator 7c to the end face 72c on the light guide 8 side through less multiple reflections and that the scintillator 7c is formed of the Y—Al—O based sintered ceramic with Ce as the activator.

Therefore, the same effect, to a varying degree, as that achieved in the above embodiment can also be achieved in the third modified example.

Fourth Modified Example

Figure 7:
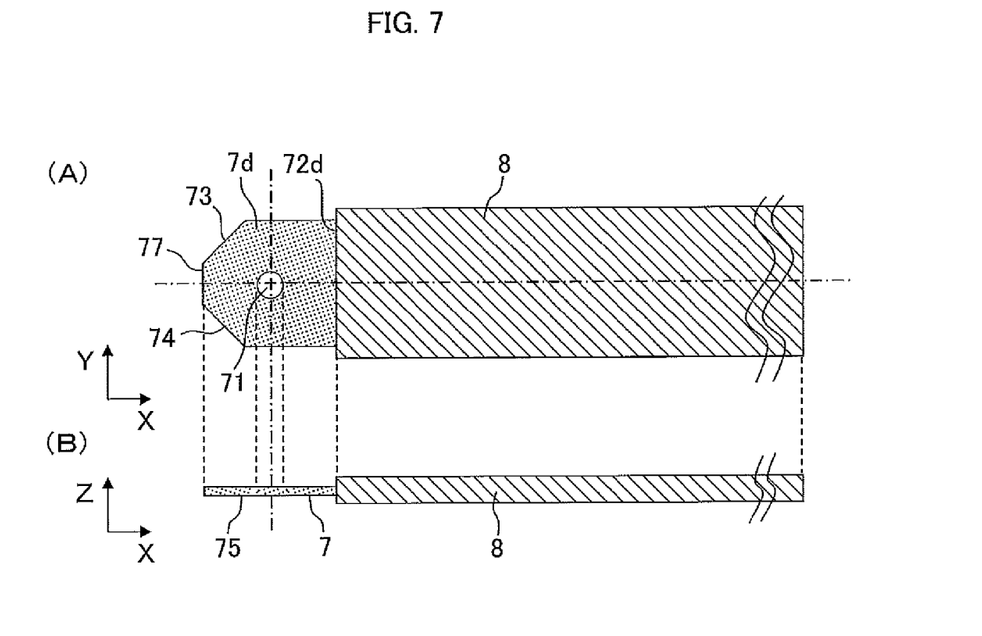
FIGS. 7A and 7B are diagrams showing an example of the shape of a scintillator according to a fourth modified example of the embodiment of the present invention, FIG. 7A showing an example of a top view and FIG. 7B showing an example of a side view.

FIGS. 7A and 7B are diagrams showing an example of the shape of a scintillator 7d according to a fourth modified example of the embodiment of the present invention. FIG. 7A shows an example of a top view and FIG. 7B shows an example of a side view. As shown in FIGS. 7A and 7B, the scintillator 7d has a shape obtained by combining the shape of the scintillator 7a according to the first modified example and the shape of the scintillator 7b according to the second modified example. In other words, an end face of an end opposite to an end face 72d of the scintillator 7d includes three end faces 73, 74 and 77.

Here, the end face 77 is formed to be approximately parallel to the end face 72d, and the end faces 73 and 74 are formed to form angles $\alpha_1$ and $\alpha_2$ (not shown) with the X-axis, respectively. Note that the angles $\alpha_1$ and $\alpha_2$ are 30 degrees≤$\alpha_1$, $\alpha_2$<90 degrees, as in the case of the above embodiment (see FIG. 3).

Also, a metal layer to be formed as a light reflection layer is formed in the same manner as in the case of the above embodiment. Moreover, a space is provided between the end face 72d of the scintillator 7d and the light guide 8. Alternatively, the scintillator 7b and the light guide 8 are joined with a junction material such as transparent resin, optical cement and matching oil.

An electron beam detector 12 and an electron microscope 100 manufactured using the scintillator 7d as described above achieve good characteristics such as high sensitivity of reflected electron detection and fast response. This means nothing other than an effect based on the fact that, in the fourth modified example, the end faces 73, 74 and 77 of the end of the scintillator 7d have a function to reflect luminescence generated in the scintillator 7d to the end face 72d on the light guide 8 side and that the scintillator 7d is formed of the Y—Al—O based sintered ceramic with Ce as the activator.

Therefore, the same effect, to a varying degree, as that achieved in the above embodiment can also be achieved in the fourth modified example.

Note that, although the end face 77 is formed to be approximately parallel to the end face 72d in this modified example, the end faces do not always have to be parallel to each other. Note, however, that the angles formed by the end face 77 and the end faces 73 and 74 are less than 180 degrees. This means that the end faces 73, 77 and 74 are a part of an outward convex polyhedron.

Fifth Modified Example

Figure 8:
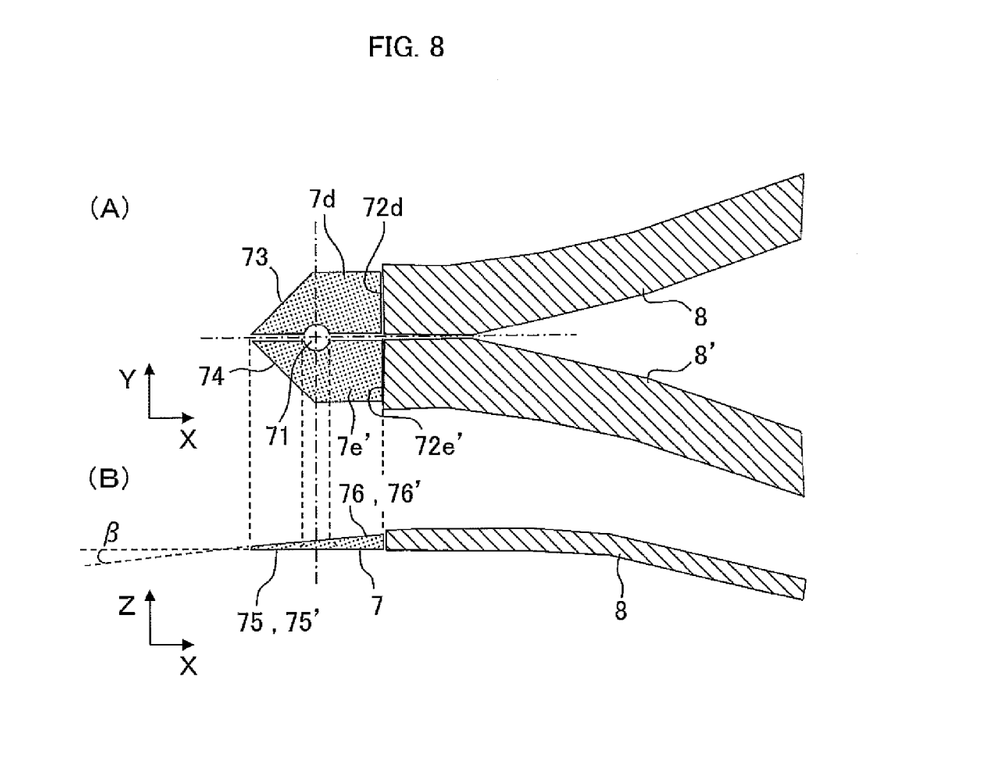
FIGS. 8A and 8B are diagrams showing an example of the shape of a scintillator according to a fifth modified example of the embodiment of the present invention, FIG. 8A showing an example of a top view and FIG. 8B showing an example of a side view.

FIGS. 8A and 8B are diagrams showing an example of the shape of scintillators 7e and 7e' according to a fifth modified example of the embodiment of the present invention. FIG. 8A shows an example of a top view and FIG. 8B shows an example of a side view. As shown in FIGS. 8A and 8B, scintillators 7e and 7e' according to the fifth modified example have a shape obtained by dividing the scintillator 7a according to the first modified example into two upper and lower (Y direction) parts. The two divided scintillators 7e and 7e' are connected to different light guides 8 and 8', respectively.

Note that, in this modified example, end faces 72e and 72e' of ends of the scintillators 7e and 7e', at which the scintillators 7e and 7e' come into contact with the light guides 8 and 8', respectively, are flat faces rather than outward convex faces. However, the end faces 72e and 72e' may be the outward convex faces.

Also, a metal layer to be formed as a light reflection layer is formed in the same manner as in the case of the above embodiment. In addition, a light reflection metal layer is also formed on an end face at the boundary between the divided scintillators 7e and 7e'. Moreover, spaces are provided between the end faces 72e and 72e' of the scintillators 7e and 7e' and the light guides 8 and 8', respectively. Alternatively, the scintillators 7e and 7e' and the light guides 8 and 8' are joined with a junction material such as transparent resin, optical cement and matching oil.

An electron beam detector 12 and an electron microscope 100 manufactured using the scintillators 7e and 7e' as described above achieve good characteristics such as high sensitivity of reflected electron detection and fast response. This means nothing other than an effect based on the fact that, in the respective scintillators 7e and 7e' according to the fifth modified example, end faces 73 and 74 tilted to the X-axis and upper faces 76 and 76' tilted at a tilt angle β to electron incident faces 75 and 75' have a function to reflect luminescence generated in the scintillators 7e and 7e' to the end faces 72e and 72e' on the light guides 8 and 8' side and that the scintillators 7e and 7e' are formed of the Y—Al—O based sintered ceramic with Ce as the activator.

Therefore, the same effect, to a varying degree, as that achieved in the above embodiment can also be achieved in the fifth modified example.

Furthermore, in this modified example, the two scintillators 7e and 7e' are connected to different photoelectric conversion elements 9 (see FIG. 1) through the different light guides 8 and 8', respectively. This means that the electron microscope 100 according to this modified example includes two independent electron beam detectors 12. Therefore, the electron microscope 100 can obtain two kinds of observation images. When a sample 5 is observed in a tilted state, for example, the way that reflected electrons 6 are emitted varies depending on unevenness on the surface of the sample 5. Thus, a difference between the observation images based on such variation can be observed from the two kinds of observation images.

Note that, although the scintillator 7 is divided into two parts in this modified example, the number of divisions is not limited to two, but may be three or more, such as four and six. Moreover, when the scintillator 7 is divided into parts, the divided scintillators 7 and 7' do not have to have shapes symmetrical to each other.

Sixth Modified Example

Figure 9:
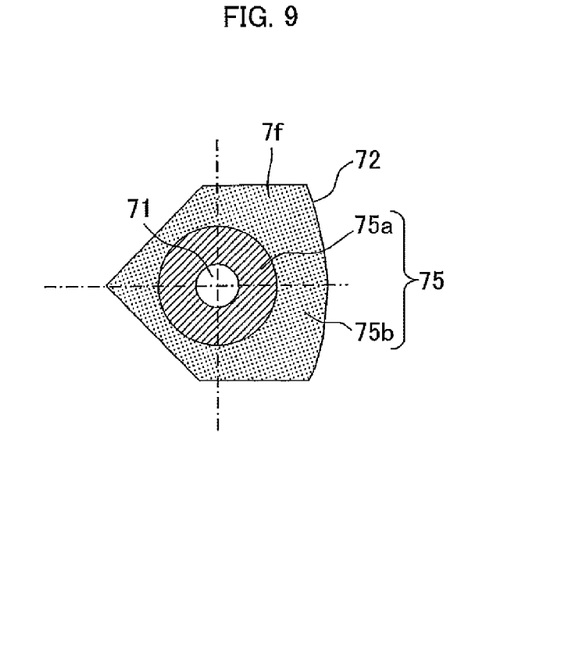
FIG. 9 is a diagram showing an example of the shape of a light reflection metal layer formed on an electron incident face of a scintillator according to a sixth modified example of the embodiment of the present invention.

FIG. 9 is a diagram showing an example of the shape of a light reflection metal layer formed on an electron incident face 75 of a scintillator 7f according to a sixth modified example of the embodiment of the present invention. Note that the shape of the scintillator 7f is the same as that of the scintillator 7 according to the above embodiment. Therefore, an electron passing hole 71 is formed approximately in the central part of the scintillator 7f.

In this modified example, a metal layer having a thickness that does not hinder the incidence of reflected electrons 6 is formed in a region 75a within a circle concentric to the electron passing hole 71 on the electron incident face 75. Also, a metal layer having a thickness that blocks the incidence of the reflected electrons 6 is formed in a region 75b outside the concentric circle. Moreover, a metal layer having a thickness that blocks the incidence of the reflected electrons 6 is formed on the faces other than the electron incident face 75 of the scintillator 7f and the end face 72 of the end in contact with the light guide 8.

Note that, when the metal layer is an Al layer, the thickness that does not hinder the incidence of the reflected electrons 6 is 100 nm or less, preferably about 50 nm, and the thickness that blocks the incidence of the reflected electrons 6 exceeds 100 nm, preferably about 200 nm.

Therefore, in this modified example, the incidence of the reflected electrons on the scintillator 7f is limited to the region 75a on the electron incident face 75. Thus, isotropy of the detection of the reflected electrons 6 is ensured. Generally, when there is a bias in emission of the reflected electrons from the sample 5, the amount of reflected electrons to be emitted cannot be accurately detected unless the amount of emission is isotropically grasped. Therefore, in the above embodiment and the modified examples thereof, since the shape of the electron incident face 75 of the scintillator 7 is not rotationally symmetric, there arises a problem that the amount of reflected electrons emitted cannot be accurately detected. The scintillator 7f according to this modified example, on the other hand, has no such problem. More specifically, in this modified example, in addition to the same effect as that in the above embodiment, an effect that enables isotropic detection of the reflected electrons 6.

Note that the present invention is not limited to the embodiment described above and the modified examples thereof, but includes various other modified examples. For example, the above embodiment is described in detail for easier understanding of the present invention, and is not necessarily limited to the one including all the configurations described. Moreover, some of the configurations in the embodiment or modified examples may be replaced with some of the configurations in another embodiment or modified examples. Furthermore, a part of or the entire configuration of another embodiment may be added to the configuration of a certain embodiment.

EXPLANATION OF REFERENCE NUMERALS 1 primary electron beam
2 scanning lens
3 objective lens
4 sample chamber
5 sample
6 reflected electron
7, 7a, 7b, 7c, 7d, 7e, 7e', 7f scintillator
8, 8' light guide
9 photoelectric conversion element
10 amplifier circuit
12 electron beam detector
14 display device
71 electron passing hole
75 electron incident face
100 electron microscope

The invention claimed is:
1. An electron microscope comprising:
a plate-like scintillator configured to make luminescence by incidence of an electron; and
a light guide having a refractive index smaller than that of the scintillator and configured to pass the luminescence made by the scintillator, wherein
the scintillator has:
a first end face which is joined to the light guide;
a second end face opposite to the first end face;
a first surface, between the first end face the second end face, on which the electron is incident;
a second surface opposite to the first surface and between the first end face and the second end face; and a light reflection layer on the second end face and the second surface, and the second surface is inclined with respect to the first surface, wherein a distance between the second surface and the first surface decreases with increasing distance from the light guide, and the second end face is so formed to have an arc becoming smaller with increasing distance from the light guide.

2. The electron microscope according to claim 1, wherein the scintillator and the light guide are joined through a material layer having a refractive index smaller than that of the scintillator.

3. The electron microscope according to claim 1, wherein a surface of the scintillator other than the first and second end face is a flat face or a curved face that is concave to an inner side of the scintillator.

4. The electron microscope according to claim 1, wherein the second end face comprises two faces extending away from the first light guide, and contacting with each other at the farthest point from the first light guide to form an angle of 180 degrees or less by the two faces.

5. The electron microscope according to claim 1, wherein light reflection layers are further formed on the first surface of the scintillator, and the light reflection layer of the second surface has a thickness greater than that of the light reflection layer of the first surface.

6. The electron microscope according to claim 1, wherein the scintillator is divided into a plurality of parts, and independent light guides are connected to the divided parts of the scintillator, respectively.

7. The electron microscope according to claim 1, wherein the scintillator is formed of Y—Al—O based sintered ceramic represented by a chemical formula $(Ln_{1-x}Ce_x)_3M_5O_{12}$ (wherein Ln represents at least one element selected from Y, Gd, La and Lu, and M represents at least one element selected from Al and Ga).

8. The electron microscope according to claim 7, wherein a Ce composition ratio x in the Y—Al—O based sintered ceramic is $0.002 \leq x \leq 0.025$.

* * * * *